United States Patent
Cox et al.

(10) Patent No.: US 7,372,293 B2
(45) Date of Patent: May 13, 2008

(54) POLARITY DRIVEN DYNAMIC ON-DIE TERMINATION

(75) Inventors: Christopher Cox, Placerville, CA (US); George Vergis, Hillsboro, OR (US); Hany Fahmy, Elk Grove, CA (US); Hideo Oie, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 11/296,950

(22) Filed: Dec. 7, 2005

(65) Prior Publication Data

US 2007/0126463 A1   Jun. 7, 2007

(51) Int. Cl.
*H03K 17/16* (2006.01)
*H03K 19/003* (2006.01)

(52) U.S. Cl. .......................... 326/30; 326/21; 326/28; 326/31

(58) Field of Classification Search ............... 326/21, 326/26–28, 30–31
See application file for complete search history.

(56) References Cited

U.S. PATENT DOCUMENTS

| | | | |
|---|---|---|---|
| 5,467,455 A * | 11/1995 | Gay et al. ................ 710/100 |
| 6,642,740 B2 * | 11/2003 | Kim et al. ................ 326/30 |
| 6,762,620 B2 * | 7/2004 | Jang et al. ................ 326/30 |
| 6,894,946 B2 * | 5/2005 | Jang ........................ 365/233 |
| 6,981,089 B2 * | 12/2005 | Dodd et al. .............. 710/308 |
| 2003/0042573 A1 | 3/2003 | Fan et al. |
| 2003/0234664 A1 * | 12/2003 | Yamagata ................ 326/30 |
| 2005/0154943 A1 | 7/2005 | Alexander et al. |
| 2005/0268059 A1 | 12/2005 | LaBerge |
| 2007/0046308 A1 | 3/2007 | Baker et al. |

OTHER PUBLICATIONS

Micron, The Future of Memory: Graphics DDR3 SDRAM Functionality, Designline vol. 11 issue 4, 8 pages, 2002, month N/A.
Micron, Graphics DDR3 On-Die Termination and Thermal Considerations, Designline vol. 12, issue 1, 8 pages, 2003, month N/A.
Micron, DDR2 Offers New Features and Functionality, Designline vol. 12, issue 2, 16 pages, Jul. 31, 2003.
U.S. Patent Application Inventor: Hsien-Pao Yang; Filing Date: Jun. 30, 2005.
Office Action dated May 2, 2007 for corresponding U.S. Appl. No. 11/296,993, filed Dec. 7, 2005, to Cox et al.
Office Action dated May 17, 2007 for corresponding U.S. Appl. No. 11/296,960, filed Dec. 7, 2005, to Vergis et al.
International Search Report and Written Opinion of the International Searching Authority, Application No. PCT/US2006/046605 mailed Aug. 17, 2007.

* cited by examiner

*Primary Examiner*—James Cho
*Assistant Examiner*—Jason Crawford
(74) *Attorney, Agent, or Firm*—Philip A. Pedigo

(57) ABSTRACT

Embodiments of the invention are generally directed to systems, methods, and apparatuses for polarity driven on-die termination. In some embodiments, an integrated circuit includes an input/output (I/O) circuit to receive a command and an on-die termination (ODT) pin to receive one or more ODT signals. The integrated circuit may further include control logic coupled to the ODT pin, the control logic to enable, at least in part, a multiplexing of an ODT activation signal and an ODT value selection signal on the ODT pin, the control logic further to control a length of termination based, at least in part, on the command. Other embodiments are described and claimed.

21 Claims, 9 Drawing Sheets

| Config | if the CMD is a | to DIMM | to Rank | Controller | Dynamic ODT ||||
| --- | --- | --- | --- | --- | --- | --- | --- | --- |
| | | | | | DIMM 1 || DIMM 2 ||
| | | | | | Rank 1 | Rank 2 | Rank 1 | Rank 2 |
| 2R/1R | WRITE | 1 | 1 | ∞ | 120 Ω | ∞ | 20 Ω | N/A |
| | WRITE | 1 | 2 | ∞ | ∞ | 120 Ω | 20 Ω | N/A |
| | WRITE | 2 | 1 | ∞ | 20 Ω | ∞ | 120 Ω | N/A |
| | READ | 1 | 1 | 120 Ω | ∞ | ∞ | 20 Ω | N/A |
| | READ | 1 | 2 | 120 Ω | ∞ | ∞ | 20 Ω | N/A |
| | READ | 2 | 1 | 120 Ω | 20 Ω | ∞ | ∞ | N/A |

400

412

| Config | if the CMD is a | to DIMM | to Rank | Controller Term | DIMM 1 Rank 1 | DIMM 1 Rank 2 | DIMM 2 Rank 1 | DIMM 2 Rank 2 |
|---|---|---|---|---|---|---|---|---|
| 2R/2R | WRITE | 1 | 1 | ∞ | 120Ω | ∞ | 40Ω | 40Ω |
| | WRITE | 1 | 2 | ∞ | ∞ | 120Ω | 40Ω | 40Ω |
| | WRITE | 2 | 1 | ∞ | 40Ω | 40Ω | 120Ω | ∞ |
| | WRITE | 2 | 2 | ∞ | 40Ω | 40Ω | ∞ | 120Ω |
| | READ | 1 | 1 | 120Ω | ∞ | ∞ | 40Ω | 40Ω |
| | READ | 1 | 2 | 120Ω | ∞ | ∞ | 40Ω | 40Ω |
| | READ | 2 | 1 | 120Ω | 40Ω | 40Ω | ∞ | ∞ |
| | READ | 2 | 2 | 120Ω | 40Ω | 40Ω | ∞ | ∞ |

414

| Config | if the CMD is a | to DIMM | to Rank | Controller Term | DIMM 1 Rank 1 | DIMM 1 Rank 2 | DIMM 2 Rank 1 | DIMM 2 Rank 2 |
|---|---|---|---|---|---|---|---|---|
| 2R/1R | WRITE | 1 | 1 | ∞ | 120Ω | ∞ | 20Ω | N/A |
| | WRITE | 1 | 2 | ∞ | ∞ | 120Ω | 20Ω | N/A |
| | WRITE | 2 | 1 | ∞ | 40Ω | 40Ω | 120Ω | N/A |
| | READ | 1 | 1 | 120Ω | ∞ | ∞ | 20Ω | N/A |
| | READ | 1 | 2 | 120Ω | ∞ | ∞ | 20Ω | N/A |
| | READ | 2 | 1 | 120Ω | 40Ω | 40Ω | ∞ | N/A |

416

| Config | if the CMD is a | to DIMM | to Rank | Controller Term | DIMM 1 Rank 1 | DIMM 1 Rank 2 | DIMM 2 Rank 1 | DIMM 2 Rank 2 |
|---|---|---|---|---|---|---|---|---|
| 1R/2R | WRITE | 1 | 1 | ∞ | 120Ω | N/A | 40Ω | 40Ω |
| | WRITE | 2 | 1 | ∞ | 20Ω | N/A | 120Ω | ∞ |
| | WRITE | 2 | 2 | ∞ | 20Ω | N/A | ∞ | 120Ω |
| | READ | 1 | 1 | 120Ω | ∞ | N/A | 40Ω | 40Ω |
| | READ | 2 | 1 | 120Ω | 20Ω | N/A | ∞ | ∞ |
| | READ | 2 | 2 | 120Ω | 20Ω | N/A | ∞ | ∞ |

418

| Config | if the CMD is a | to DIMM | to Rank | Controller Term | DIMM 1 Rank 1 | DIMM 1 Rank 2 | DIMM 2 Rank 1 | DIMM 2 Rank 2 |
|---|---|---|---|---|---|---|---|---|
| 1R/1R | WRITE | 1 | 1 | ∞ | 120Ω | N/A | 20Ω | N/A |
| | WRITE | 2 | 1 | ∞ | 20Ω | N/A | 120Ω | N/A |
| | READ | 1 | 1 | 120Ω | ∞ | N/A | 20Ω | N/A |
| | READ | 2 | 1 | 120Ω | 20Ω | N/A | ∞ | N/A |

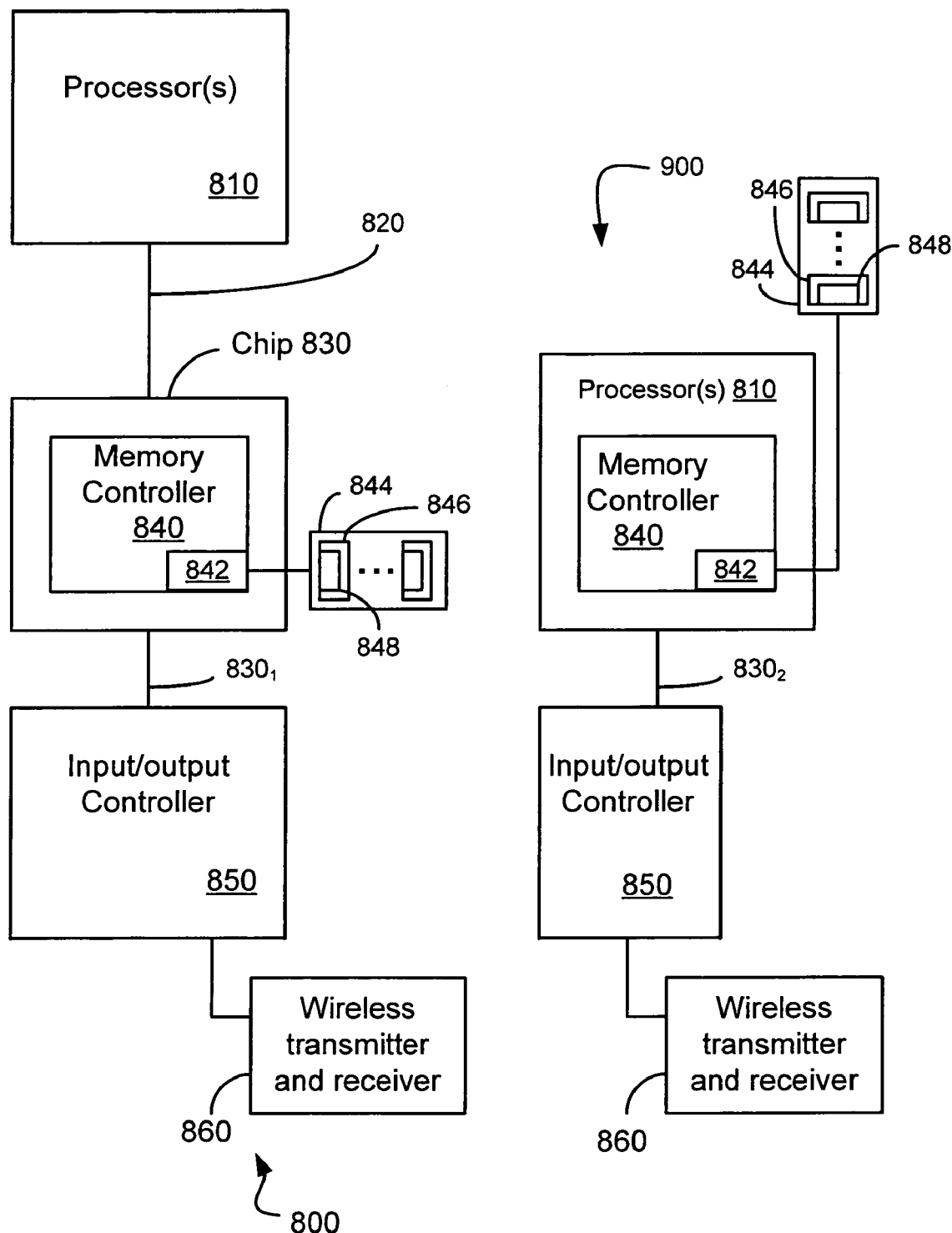

POLARITY DRIVEN DYNAMIC ON-DIE TERMINATION

TECHNICAL FIELD

Embodiments of the invention generally relate to the field of integrated circuits and, more particularly, to systems, methods and apparatuses for time multiplexed on-die termination.

BACKGROUND

The operating frequencies of integrated circuits such as memory devices are progressively increasing. To take advantage of these high frequencies computing systems are designed to transmit signals along their busses and between system components at comparable frequencies.

Some difficulties may be encountered when transmitting and receiving data between system components (e.g., between integrated circuits) at high frequencies. Buses behave like transmission lines, where impedance mismatches lead to signal reflection and interference effects. Termination resistance can be used to maintain signal quality over interconnections by matching impedances to minimize signal reflections.

Conventional memory systems, such as double data rate (DDR) dynamic random access memory devices (DRAMs) typically have multi-drop bus architectures that are terminated with a resistor that is resident on the motherboard. In other conventional memory systems, the termination resistor is resident on the integrated circuit.

The term "on-die termination (ODT)" refers to termination resistance that is resident on the integrated circuit. In conventional systems, the value of ODT is set when a computing system is initialized. After initialization, the ODT can be activated or deactivated with the value that is set during initialization.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4B is a chart diagram illustrating selected aspects of an alternative example of ODT control logic according to an embodiment of the invention.

FIGS. 8A and 8B are block diagrams illustrating selected aspects of computing systems.

DETAILED DESCRIPTION

Embodiments of the invention are generally directed to systems, methods, and apparatuses for polarity driven on-die termination. In an embodiment, an integrated circuit receives, during a first clock, an on-die termination (ODT) activation signal at its ODT pin. The integrated circuit also receives, during a second clock, an ODT value selection signal on its ODT pin. In some embodiments, the integrated circuit internally controls the length of termination. For example, in some embodiments, the integrated circuit internally determines when the ODT will be deactivated.

Figure 1:
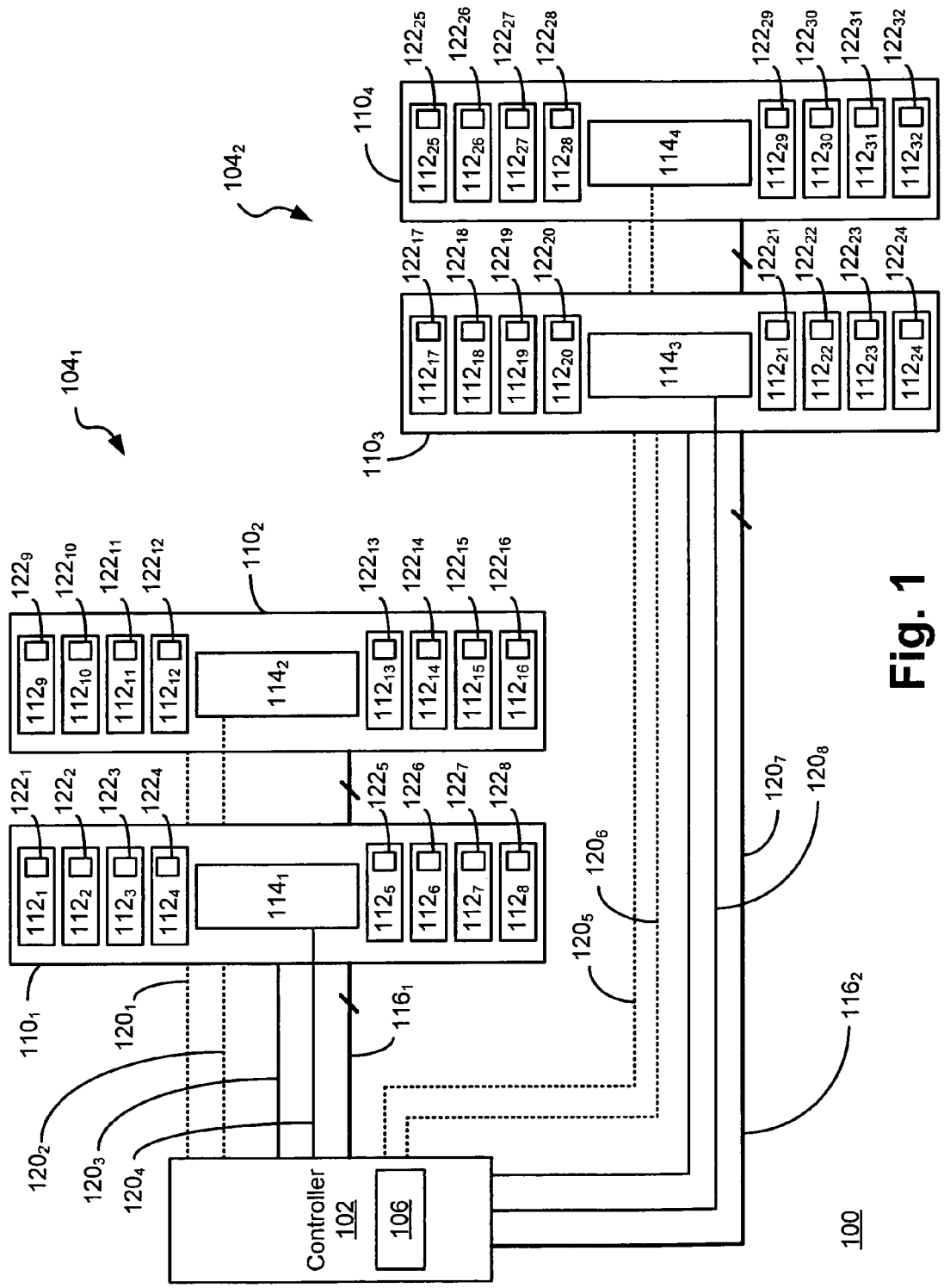
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. Computing system 100 includes controller 102 and two memory channels 104. Controller 102 may be any type of controller suitable for controlling, at least in part, the transfer of information between a processor (not shown) and one or more integrated circuits (e.g., memory devices). In some embodiments, controller 102 is a memory controller. Controller 102 includes on-die termination (ODT) control logic 106. As is further described below, in an embodiment, ODT control logic 106 determines an appropriate ODT value for one or more of the integrated circuits in system 100.

Memory channels 104 include memory modules 110 each having, for example, two ranks of memory devices (e.g., one on either side). Memory modules 110 may be based on printed circuit boards having fingers along both sides of one edge to create a dual inline memory module (DIMM) that may be plugged into a connector on another circuit board that holds other components of the system. Modules 110 are populated with memory devices 112. The memory devices may be commodity-type dynamic random access memory (DRAM) such as double data rate (DDR) DRAM. In an embodiment, each module 110 includes two ranks (e.g., one on each side of the module). Registers 114 may receive and store information for a corresponding rank.

In an embodiment, controller 102 is coupled with modules 110 via interconnect 116. Interconnect 116 may include an arbitrary number of data lines, address lines, chip select lines and/or other lines. In addition, memory controller 102 is coupled with each rank via on-die termination (ODT) lines 120. In an embodiment, ODT lines 120 provide ODT activation signals for memory devices 112. An ODT activation signal refers to a signal that activates ODT for an integrated circuit or a group of integrated circuits. As is further discussed below, ODT lines 120 may also provide an ODT value selection signal for memory devices 112. An ODT value selection signal refers to a signal that indicates a desired ODT value. In some embodiments, the ODT activation signal activates ODT for an entire rank of memory devices 112. Similarly, in some embodiments, the ODT value selection signal selects an ODT value for an entire rank of memory devices 112. In such embodiments, the ODT pins for the memory devices within a rank may be daisy-chained together so that the same ODT signals (e.g., ODT activation signals and ODT value selection signals) are routed to the memory devices within the rank.

The number of memory channels, memory modules, and memory devices shown in FIG. 1 are for illustrative purposes. An embodiment of the invention may have a different number of memory channels, a different number of memory modules, and/or a different number of memory devices. In addition, the topology and architecture illustrated in FIG. 1 are for illustrative purposes. An embodiment of the invention may have a different topology and/or different architectural features.

Figure 2:
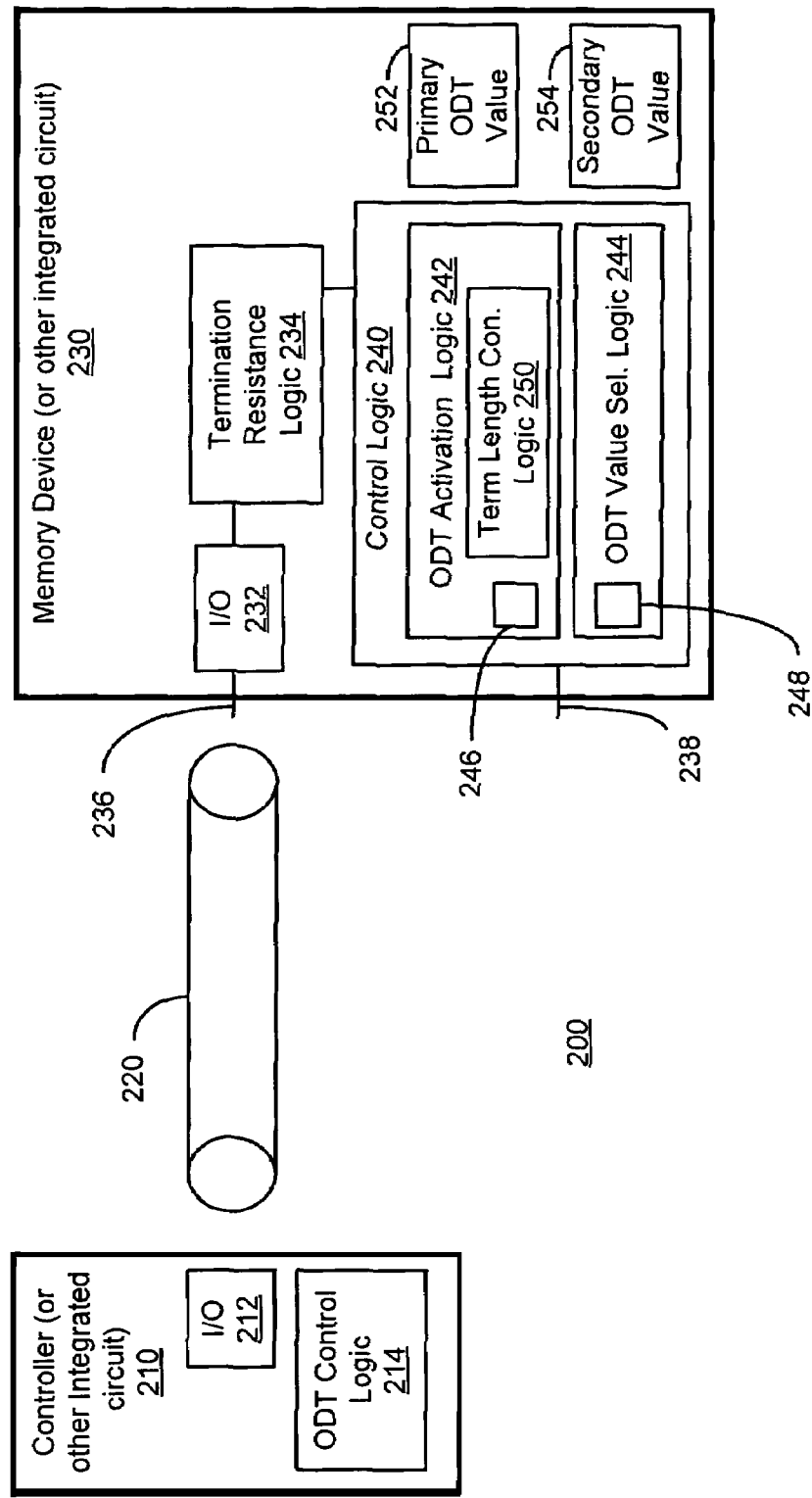
FIG. 2 is a block diagram illustrating selected aspects of a computing system implemented according to an embodiment of the invention.

FIG. 2 is a block diagram illustrating selected aspects of a computing system implemented according to an embodiment of the invention. Computing system 200 includes memory controller 210 and memory device 230 coupled together by interconnect 220. In some embodiments, memory controller 210 is part of the chipset for computing system 200 and memory device 230 is part of the memory subsystem for computing system 200. Memory device 230 may be a DRAM such as a DDR3 synchronous DRAM (SDRAM). Interconnect 220 broadly represents, for example, a number of different data lines, address lines, control lines, and the like.

Memory controller 210 includes input/output (I/O) circuit 212 and ODT control logic 214. I/O circuit 212 can be any I/O circuit suitable for transmitting and receiving information (e.g., data, ODT signals, addresses, etc.) with memory device 230. In some embodiments, ODT control logic 214 determines the appropriate ODT value for memory controller 210 and/or memory device 230. For example, ODT control logic 214 may dynamically determine an appropriate ODT value for memory controller 210 and/or memory device 230 during both read and write operations. ODT control logic 214 is further discussed below in FIGS. 4A and 4B.

Memory device 230 includes I/O circuit 232, termination resistance logic 234, and control logic 240. I/O circuit 232 may be any I/O circuit suitable for transmitting and receiving information (e.g., data, ODT signals, addresses, etc.) with memory controller 210. In some embodiments, termination resistance logic 234 includes a plurality of termination legs that can be selectively activated to dynamically provide a plurality of termination resistances for I/O circuit 232.

Memory device 230 is coupled to interconnect 220 through a plurality of pins including, for example, pins 236 and 238. The term "pin" broadly refers to an electrical interconnection for an integrated circuit (e.g., a pad or other electrical contact on the integrated circuit). For ease of description, FIG. 2 illustrates an individual pin 236 but it is to be appreciated that, typically, a plurality of pins are used to convey data, addresses, commands (e.g., read/write pins), and the like. In an embodiment, pin 238 is an ODT pin. An ODT pin refers to a pin that, in some conventional systems, receives an ODT activation signal.

In an embodiment, control logic 240 enables two or more signals to be multiplexed (e.g., time multiplexed) on ODT pin 238. For example, in some embodiments, control logic 240 enables an ODT activation signal and an ODT value selection signal to be multiplexed on ODT pin 238. In some embodiments, control logic 240 may recognize and latch each of the different signals that are multiplexed on ODT pin 238. The latch(es) may stay set for a defined period of time (e.g., a certain number of clock cycles) to deny a reset of the state of the latches by, for example, controller 210. After the defined length of time, control logic 240 may allow a reset of the state to return control of the ODT pin to controller 210.

In some embodiments, control logic 240 includes ODT activation logic 242 and ODT value selection logic 244. ODT activation logic 242 detects an ODT activation signal on ODT pin 238 and activates termination resistance logic 234 responsive to receiving the ODT activation signal. In some embodiments, ODT activation logic 242 includes latch 246. Latch 246 recognizes and latches ODT activation signals that are received on ODT pin 238. Latch 246 may stay set for a defined period of time after it detects an ODT activation signal. For example, in some embodiments, latch 246 stays set for two clock cycles after it detects an ODT activation signal. Since latch 246 stays set for a defined length of time, additional signals (e.g., an ODT value selection signal) may be received on ODT pin 238 without resetting the ODT activation signal. In some embodiments, the period of time that latch 246 stays set may be configurable (e.g., by setting a value in a value in a register).

In some embodiments, memory device 230 is capable of determining when to deactivate its ODT (e.g., when to deactivate termination resistance logic 234). The term "length of termination" broadly refers to the amount of time that the ODT is activated. The illustrated embodiment of ODT activation logic 242 includes termination length control logic 250. Termination length (TL) control logic 250 determines an appropriate length of termination for the ODT provided by termination resistance logic 234.

In some embodiments, TL control logic 250 determines the length of termination based, at least in part, on a command (e.g., a read or write command) received from controller 210. For example, in some embodiments, TL control logic 250 decodes (or partly decodes) the received command and determines a burst length associated with the command. TL control logic 250 may then determine a termination length based, at least in part, on the burst length. For example, the length of termination may be based, at least in part, on the expression: BL/M+N (where BL is the burst length of the associated command). In some embodiments, M and N are both equal to two. In alternative embodiments, the length of termination may be based on a different expression and/or the values of M and/or N may be different.

In some embodiments, TL control logic 250 deactivates the ODT subsequent to the expiration of the length of termination. Control logic 240 may then return control of the ODT to controller 210. Returning control of the ODT to controller 210 may include, for example, allowing latches 246 and 248 to be set/reset by controller 210.

ODT value selection logic 244 detects an ODT value selection signal on ODT pin 238 and then sets the resistance level of termination resistance logic 234 based (at least partly) on the received ODT value selection signal. In some embodiments, registers 252 and 254 are configured, respectively, with a primary and a secondary ODT value during, for example, system initialization. In such embodiments, ODT value selection logic 244 selects an ODT value from either register 252 or 254 based on the received ODT value selection signal. For example, if the ODT value selection signal is high (logically), then ODT value selection logic 244 may select a value from register 252. Similarly, if the ODT value selection signal is low, then ODT value selection logic 244 may select a value from register 254. In some embodiments, ODT value selection logic 244 includes latch 248. Latch 248 recognizes and latches ODT value selection signals that are received on ODT pin 238. Latch 248 may stay set for a defined period of time after it detects an ODT value selection signal.

Figure 3:
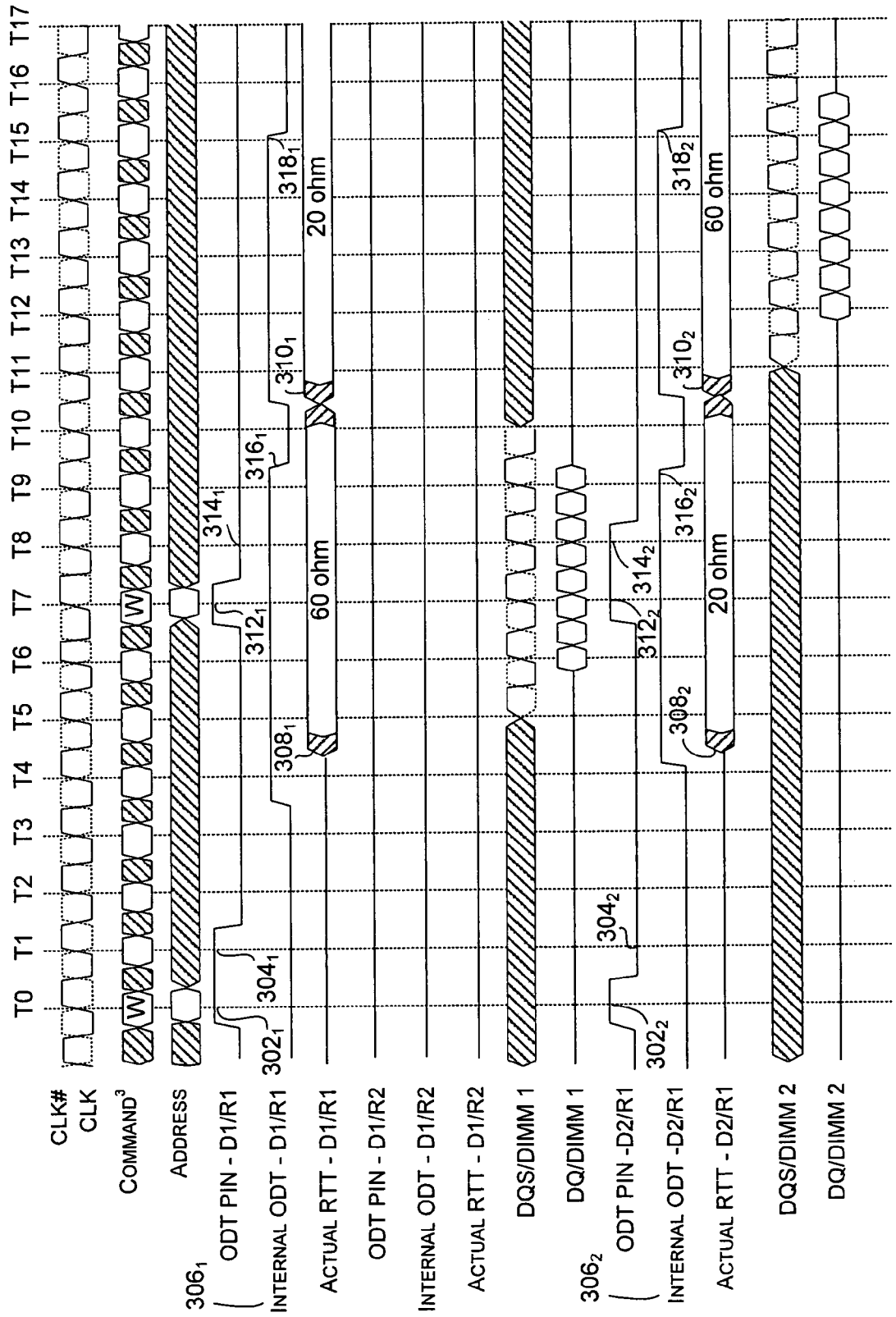
FIG. 3 is a timing diagram illustrating selected aspects of on-die termination (ODT) activation and ODT value selection according to an embodiment of invention.

FIG. 3 is a timing diagram illustrating selected aspects of ODT activation and ODT value selection according to an embodiment of invention. The timing diagram illustrates back to back writes (e.g., DIMM to DIMM) for a memory system having a 2R/1R configuration. The first write is to DIMM 1, Rank 1 (D1/R1) and the second write is to D2/R1. As is further described below, in some embodiments, a DRAM is capable of time multiplexing the signals it receives on its ODT pin and internally controls the length of termination for the ODT.

In some embodiments, a DRAM can time multiplex two or more signals on its ODT pin because it recognizes and latches each of the different signals. Referring to 302, for example, D1/R1 and D2/R1 receive and recognize an ODT activation signal. D1/R1 and D2/R1 latch the received ODT activation signal and prevent a reset of the latches for a defined length of time. Referring to 304, D1/R1 and D2/R1 receive and latch the ODT value selection signals on their respective ODT pins. In some embodiments, if the ODT value selection signal is a logic high, then the DRAM references a first register to obtain the ODT value (e.g., register 252, shown in FIG. 2). Similarly, if the ODT value selection signal is a logic low, then the DRAM references a second register to obtain the ODT value (e.g., register 254, shown in FIG. 2). Thus, at T0 the DRAMs recognize (and latch) the ODT activation signal and at T1 the DRAMs recognize (and latch) the ODT value selection signal. The ODT for each DRAM is activated with the appropriate value as shown by 308.

In some embodiments, a DRAM (e.g., any or all of the DRAMs associated with D1/R1 and/or D2/R1) internally controls the length of termination. That is, in some embodiments, a DRAM determines a length of termination for a command and then deactivates the ODT after the length of termination transpires. In the illustrated embodiment, the internal control of the ODT is illustrated by the internal ODT signal for each rank of memory (e.g., 306). The DRAMs in D1/R1 deactivate the internal ODT at $316_1$ and the memory devices in D2/R1 deactivate the internal ODT at $316_2$. In some embodiments, each DRAM releases control of the ODT pin subsequent to deactivating the ODT. For example, if the signal on the ODT pin goes high at T7, then the DRAMs recognize that the ODT activation signal is being asserted.

The ODT activation signal is asserted again at T7 as shown by 312. In some embodiments, the DRAMs latch the ODT activation signal and prevent a reset of that signal for a defined period of time. Two or more signals may be multiplexed on the ODT pin because the DRAMs recognize and latch the received signals. For example, the DRAMs recognize at T8 that the ODT value selection signal is present on their respective ODT pins (314). In some embodiments, the DRAMs internally control the length of termination and then return control of the ODT pin to (for example) the memory controller at T15 (as shown by 318).

Embodiments of the invention support dynamic ODT without adding new pins to a DRAM by time multiplexing the signals received on the ODT pin. Since the ODT value for each rank of memory can be dynamically selected, there is improved balance in termination of the memory channel. For example, FIG. 3 illustrates back-to-back writes to D1/R1 and D2/R1. The ODT value for D1/R1 is dynamically set to 60 Ohms ($308_1$) when the memory controller is writing to D1/R1 and 20 Ohms ($310_1$) when the memory controller is writing to D2/R1. Similarly, the ODT value for D2/R1 is dynamically set to 20 Ohms ($308_2$) when the memory controller is writing to D1/R1 and 60 Ohms ($310_2$) when the memory controller is writing to D2/R1.

Figure 4A:
FIG. 4A is a chart diagram illustrating selected aspects of ODT control logic according to an embodiment of the invention.

FIG. 4A is a chart diagram illustrating selected aspects of ODT control logic according to an embodiment of the invention. The ODT control logic illustrated in chart 400 may be used by a memory controller to dynamically set the appropriate ODT values according to an embodiment of the invention. It is to be appreciated that the configuration and the values shown in FIG. 4 are selected for the purposes of illustration. Embodiments of the invention may have a different configuration and/or have different values than those shown in FIG. 4. In the illustrated embodiment, the memory system includes two dual inline memory modules (DIMMs) which are designated: DIMM 1 and DIMM 2. DIMM 1 has two ranks of memory devices and DIMM 2 has one rank of memory devices. Each row in chart 400 shows a command and the ODT values associated with the command. Using row 402 as an example, if the memory controller issues a write command to DIMM 1, Rank 1 (D1/R1), then the controller's termination is set to infinity (e.g., off) and the ODT value for D1/R1 is 120 Ohms. In addition, the ODT value for D1/R2 is infinity and D2/R1 is set to 20 Ohms. The remaining rows in chart 400 illustrate examples of appropriate ODT values for read and write commands to various combinations of DIMMs and Ranks, according to an embodiment of the invention.

FIG. 4B is a chart diagram illustrating selected aspects of an alternative example of ODT control logic according to an embodiment of the invention. Chart 410 illustrates an example in which a memory controller dynamically controls the ODT for two memory channels each having two DIMMs. The ODT values for the first memory channel are illustrated by 412 and 414. The ODT values for the second memory channel are illustrated by 416 and 418. It is to appreciated that the configurations and/or the values shown in FIG. 4B are selected for the purposes of illustration. Embodiments of the invention may include different configurations and/or different ODT values.

Figure 5:
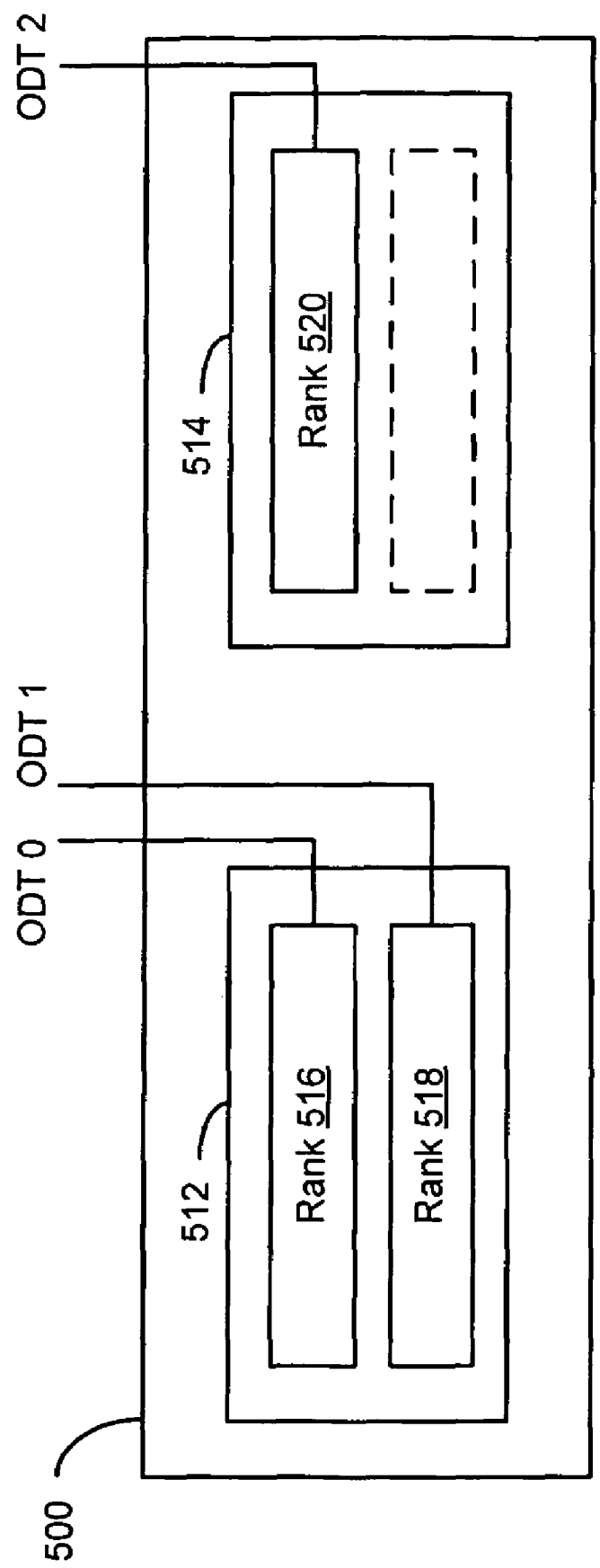
FIG. 5 is a block diagram illustrating selected aspects of balancing termination within a memory system, according to an embodiment of the invention.

FIG. 5 is a block diagram illustrating selected aspects of balancing termination within a memory system, according to an embodiment of the invention. Memory system 500 includes memory modules (e.g., DIMMs) 512 and 514. Module 512 includes ranks 516-518 and module 514 includes rank 520. Thus, memory system 500 has a 2R/1R configuration. It is to be appreciated that the illustrated configuration is merely for the purposes of illustration and embodiments of the invention may have a wide variety of configurations. Each of the illustrated ranks includes a plurality of memory devices (e.g., DRAMs). In some embodiments, each memory device includes a first register to hold a first ODT value and a second register to hold a second ODT value. The memory devices within a given rank may store the same values in their respective registers. Thus, all of the memory devices in rank 516, for example, may be configured with a first ODT value in their respective first registers and a second ODT value in their respective second registers.

In an embodiment, the memory devices in ranks 516 and 518 are configured to store an ODT value of 120 Ohms in a first register and 40 Ohms in a second register. The memory devices in rank 520 are configured to store a value of 120 Ohms in a first register and 20 Ohms in a second register. In such an embodiment, the effective resistance for either module 512 or module 514 may appear to be substantially equal to 20 Ohms. It is to be appreciated that, in practice, embodiments of the invention may include a wide variety of configurations and/or a wide variety ODT values.

Figure 6:
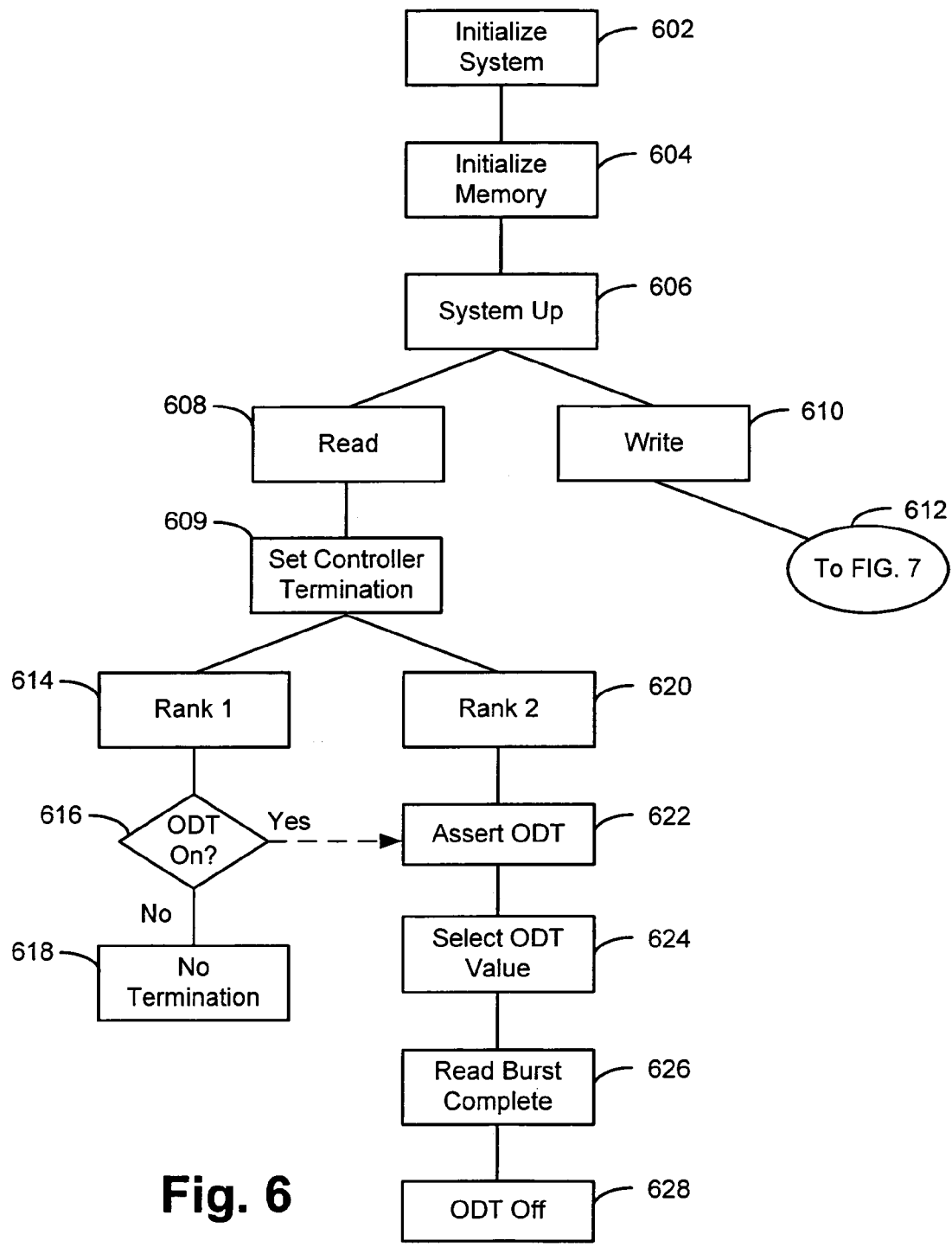
FIG. 6 is a flow diagram illustrating selected aspects of a method for reading from a memory device having ODT implemented according to an embodiment of the invention.

FIG. 6 is a flow diagram illustrating selected aspects of a method for reading from a memory device having ODT implemented according to an embodiment of the invention. A computing system is initialized at 602. Initializing the computing system may include booting the system, powering-up the system from a low power state, resetting the system (or a portion of the system), and the like.

Referring to process block 604, aspects of the computing system's memory are initialized. In some embodiments, the computing system's basic input/output system (BIOS) manages aspects of the initialization. In other embodiments, the computing system's memory controller manages aspects of the initialization process. The initialization process may include setting ODT values in one or more registers of each memory device within the memory system. For example, for each memory device, a first ODT value may be set in a first register and a second ODT value may be set in a second register.

After the initialization process, the computing system may read and write data to the memory system as shown by 606. If the memory controller issues a write command (610), then the process flow continues in FIG. 7 as shown by 612. Alternatively, if the memory controller issues a read command, then process flow continues at 608. In some embodiments, the ODT of the memory controller may be set to an appropriate value prior to reading data from a rank of memory as shown by 609. In the illustrated example, there are two ranks (respectively shown by 614 and 620) and the read command may be directed to either rank. For ease of description, the process flow shown in FIG. 6 follows the case in which the read command is directed to rank 2. Thus, the ODT for rank 1 may (but is not required to) be deactivated so that rank 1 has no termination as shown by 616 and 618 respectively. It is to be appreciated that the process flow for reading from rank 1 may be substantially similar to the process flow for reading from rank 2.

Referring to process block 622, the memory controller (or other integrated circuit) asserts the ODT activation signal. In some embodiments, the memory controller asserts the ODT activation signal based, at least in part, on ODT control logic (e.g., ODT control logic 214, shown in FIG. 2). The memory devices of rank 2 detect that the ODT activation signal is asserted. In some embodiments, each memory device includes control logic (e.g. control logic 240, shown in FIG. 2) to detect the ODT activation signal on an ODT pin. The control logic in the memory devices may latch the ODT activation signal for a defined period of time during which a reset of the state of the latch is denied.

Referring to process block 624, the memory controller selects on ODT value for the memory devices in rank 2. For example, the memory controller may send an ODT value selection signal to each memory device in rank 2. Alternatively, the memory controller may send the ODT value selection signal to rank 2 which may, in turn, distribute the signal to each memory device within the rank. The memory devices may receive the ODT value selection on their respective ODT pins. Thus, in some embodiments, the ODT activation signal and the ODT value selection signal are time multiplexed on the ODT pin.

In response to receiving the ODT activation signal and the ODT value selection signal, the memory devices may provide an appropriate level of termination. In some embodiments, the memory devices may internally control the length of termination (using, e.g., TL control logic 250, shown in FIG. 2) and then return control of the ODT to the controller. Subsequently, the memory controller may read a burst of data from rank 2. Referring to process block 626, the read burst is complete. In some embodiments, the memory devices allow the state(s) of their internal control logic (e.g., ODT activation state and/or selected ODT value) to be reset after a defined period of time. The memory devices deactivate the ODT as shown by 628.

Figure 7:
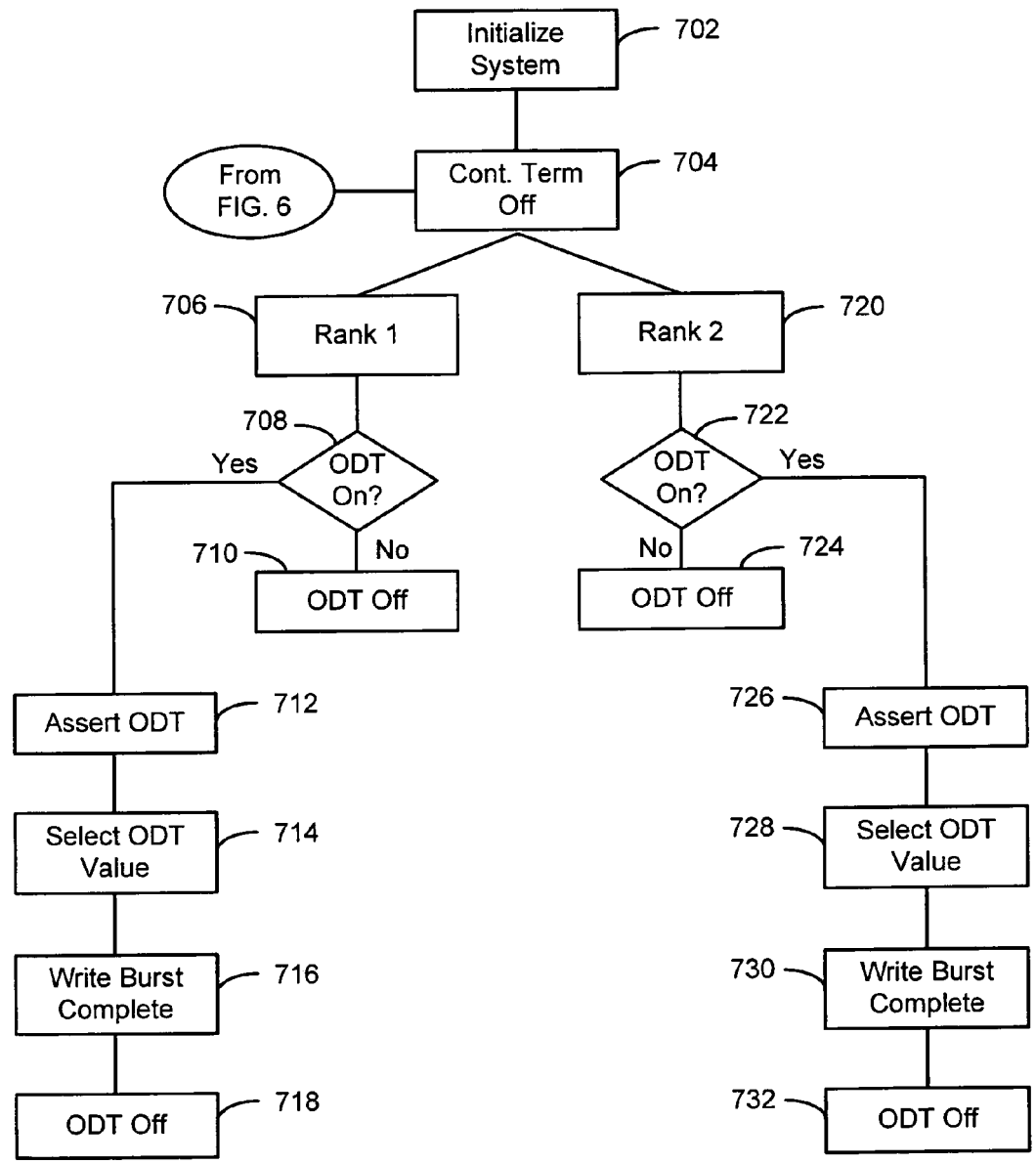
FIG. 7 is a flow diagram illustrating selected aspects of a method for writing to a memory device having ODT implemented according to an embodiment of the invention.

FIG. 7 is a flow diagram illustrating selected aspects of a method for writing to a memory device having ODT implemented according to an embodiment of the invention. Referring to process block 702, the system is initialized. Initializing the computing system may include booting the system, powering-up the system from a low power state, resetting the system (or a portion of the system), and the like. In some embodiments, the ODT of the memory controller may be deactivated prior to writing data to a rank of memory. In alternative embodiments, the ODT of the memory controller may be set to an appropriate value prior to writing data to the rank of memory.

For ease of description, the embodiment illustrated in FIG. 7 includes two ranks as shown, respectively, by reference numbers 706 and 720. It is to be appreciated, however, that embodiments of the invention may have more ranks of memory or fewer ranks of memory. For ease of description, the process flow associated with writing to rank 1 is described below. It is to be appreciated that the process flow for writing to rank 2 may be substantially the same as the process flow for writing to rank 1.

Referring to process block 708, the memory controller determines whether to activate the ODT for rank 2. For example, the memory controller may implement ODT control logic to determine whether and when to activate ODT for one or more ranks of memory. If the memory controller decides to not use ODT, then it may deactivate the ODT for rank 2, as shown by 710.

Alternatively, the memory controller may activate the ODT for each memory device in rank 2 by asserting an ODT activation signal as shown by 712. In some embodiments, each memory device within rank 2 includes control logic to recognize and latch the ODT activation signal which may be received on an ODT pin of each memory device. The control logic may prevent a reset of the latch for a defined period of time so that two or more signals can be multiplexed on the ODT pin.

Referring to process block 714, the memory controller selects an ODT value for the memory devices in rank 2. In some embodiments, the memory controller makes the selection based, at least in part, on ODT control logic (see, e.g., FIGS. 4A and 4B). The memory controller may assert an ODT value selection signal on the same line through which the ODT activation signal is sent. Each memory device in rank 2 may recognize and latch the ODT value selection signal when it is received. The memory devices may activate an appropriate level of termination in response to receiving the ODT activation signal and the ODT value selection signal. In some embodiments, the memory devices internally control the length of termination (using, e.g., TL control logic 250, shown in FIG. 2) and then return control to the ODT to the controller.

The memory controller may write data to rank 2 (e.g., in a write burst) after the memory devices have activated the appropriate level of termination. Referring to process block 716, the write burst is complete. In some embodiments, the memory devices return control of resetting the ODT activation state to the controller after a defined period of time. Referring to process block 718, the memory devices deactivate the ODT activation signal. Process blocks 722-732 illustrate aspects of the process flow for writing to rank 2. This process flow is not described in further detail because it is substantially the same as the process flow for writing to rank 1.

FIGS. 8A and 8B are block diagrams illustrating, respectively, selected aspects of computing systems 800 and 900. Computing system 800 includes processor 810 coupled with an interconnect 820. In some embodiments, the term processor and central processing unit (CPU) may be used interchangeably. In one embodiment, processor 810 is a processor in the XEON® family of processors available from Intel Corporation of Santa Clara, Calif. In an alternative embodiment, other processors may be used. In yet another alternative embodiment, processor 810 may include multiple processor cores.

In one embodiment, chip 830 is a component of a chipset. Interconnect 820 may be a point-to-point interconnect or it may be connected to two or more chips (e.g., of the chipset). Chip 830 includes memory controller 840 which may be coupled with main system memory (e.g., as shown in FIG. 1). In an alternative embodiment, memory controller 840 may be on the same chip as processor 810 as shown in FIG. 8B.

Memory system 844 may provide main memory for computing system 800 (and computing system 900). In some embodiments, each memory device 846 within memory system 844 includes control logic 848. Control logic 848 enables memory device 846 to multiplex two or more signals on, for example, an ODT pin. In addition, memory controller 840 may include ODT control logic 842. In some embodiments, ODT control logic 842 enables memory controller 840 to determine an appropriate ODT value for the memory devices in memory system 844.

Input/output (I/O) controller 850 controls the flow of data between processor 810 and one or more I/O interfaces (e.g., wired and wireless network interfaces) and/or I/O devices. For example, in the illustrated embodiment, I/O controller 850 controls the flow of data between processor 810 and wireless transmitter and receiver 860. In an alternative embodiment, memory controller 840 and I/O controller 850 may be integrated into a single controller.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An integrated circuit comprising:
an input/output (I/O) circuit to receive a command;
an on-die termination (ODT) pin to receive one or more ODT signals;
control logic coupled to the ODT pin, the control logic to enable, at least in part, a multiplexing of an ODT activation signal and an ODT value selection signal on the ODT pin, the control logic further to control a length of termination based, at least in part, on the command, wherein the control logic includes
 ODT activation logic to detect, during a first clock, an ODT activation signal on the ODT pin, and
 ODT value selection logic to detect, during a second clock, an ODT value selection signal on the ODT pin and to select one of a first ODT value and a second ODT value based, at least in part, on the ODT value selection signal; and
a termination resistance circuit coupled with the control logic and the I/O circuit, the termination resistance circuit to dynamically provide one of a primary ODT resistance and a secondary ODT resistance for the I/O circuit.

2. The integrated circuit of claim 1, wherein the ODT activation logic is further to decode the command and to determine a termination length based, at least in part, on the command.

3. The integrated circuit of claim 1, further comprising:
a first register to contain the primary ODT value; and
a second register to contain the secondary ODT value.

4. The integrated circuit of claim 3, wherein the ODT value selection logic is to
select the primary ODT value from the first register, if the ODT value selection signal is a logic one; and
select the secondary ODT value from the second register, if the ODT value selection signal is a logic zero.

5. The integrated circuit of claim 1, wherein the command includes an associated burst length (BL) and further wherein the control logic to control the length of termination based, at least in part, on the command comprises:
control logic to determine the length of termination based, at least in part, on the burst length (BL).

6. The integrated circuit of claim 5, wherein the control logic to determine the length of termination based, at least in part, on the burst length (BL) comprises:
control logic to determine the length of termination based, at least in part, on the expression (BL/M)+N.

7. The integrated circuit of claim 6, wherein M and N equal two.

8. The integrated circuit of claim 1, wherein the integrated circuit comprises a memory device.

9. A method comprising:
receiving, at a first clock, a command on an input/output (I/O) circuit of an integrated circuit;
receiving, at the first clock, an on-die termination (ODT) activation signal on an ODT pin of the integrated circuit;

receiving, at a second clock, an ODT value selection signal on the ODT pin of the integrated circuit;

determining a length of termination based, at least in part, on the command from the external controller; and providing a termination resistance for the I/O circuit during a period substantially equal to the length of termination.

10. The method claim 9, wherein the second clock is subsequent to the first clock.

11. The method claim 9, further comprising:

selecting an ODT value responsive, at least in part, to receiving the ODT value selection signal.

12. The method of claim 11, wherein selecting the ODT value responsive, at least in part, to receiving the ODT value selection signal comprises:

selecting a primary ODT value, if the ODT value selection signal is a logic one; and selecting a secondary ODT value, if the ODT value selection signal is a logic zero.

13. The method of claim of claim 9, wherein determining the length of termination based, at least in part, on the command from the external controller comprises:

decoding the command;

determining a burst length (BL) associated with the command; and determining the length of termination based, at least in part, on the burst length associated with the command.

14. The method of claim 13, wherein determining the length of termination based, at least in part, on the burst length associated with the command comprises:

determining the length of termination based, at least in part, on the expression (BL/M)+N.

15. The method of claim 14, wherein M and N are each equal to two.

16. The method of claim 9, wherein receiving, at the first clock, the ODT activation signal on an ODT pin of the integrated circuit further comprises:

preventing a reset of a state of the ODT activation signal for a predetermined period of time to allow for a time multiplexing of signals on the ODT pin.

17. A system comprising:

a first integrated circuit coupled to an interconnect; and a second integrated circuit coupled to the first integrated circuit via the interconnect, the second integrated circuit including, an input/output circuit to receive a command;

an on-die termination pin, and control logic coupled to the ODT pin, the control logic to enable, at least in part, a multiplexing of an ODT activation signal and ODT value selection signal on the ODT pin, the control logic farther to control a length of termination based, at least in part, on the command, wherein the control logic includes ODT activation logic to detect, during a first clock, an ODT activation signal on the ODT pin, and ODT value selection logic to detect, during a second clock, an ODT value selection signal on the ODT pin and to select one of a primary ODT value and secondary ODT value based, at least in part, on the ODT value selection signal.

18. The system of claim 17, wherein the control logic is to prevent a reset of a state of the ODT activation signal for a predetermined period of time to enable a time multiplexing of signals on the ODT pin.

19. The system of claim 17, wherein the first integrated circuit comprises a memory controller.

20. The system of claim 17, wherein the second integrated circuit comprises a memory device.

21. The system of claim 20, wherein the memory device is a dynamic random access memory device.

* * * * *